United States Patent
Zheng et al.

(10) Patent No.: US 11,993,839 B2
(45) Date of Patent: May 28, 2024

(54) MASK AND METHOD OF MANUFACTURING THE SAME, AND MASK ASSEMBLY

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Yong Zheng, Beijing (CN); Shuai Du, Beijing (CN); Wenbiao Ding, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 729 days.

(21) Appl. No.: 17/055,508

(22) PCT Filed: Mar. 11, 2020

(86) PCT No.: PCT/CN2020/078723
§ 371 (c)(1),
(2) Date: Nov. 13, 2020

(87) PCT Pub. No.: WO2020/192420
PCT Pub. Date: Oct. 1, 2020

(65) Prior Publication Data
US 2021/0123129 A1   Apr. 29, 2021

(30) Foreign Application Priority Data
Mar. 28, 2019 (CN) .......................... 201910244878.2

(51) Int. Cl.
*C23C 14/04* (2006.01)
*B05C 21/00* (2006.01)
(Continued)

(52) U.S. Cl.
CPC .......... *C23C 14/042* (2013.01); *B05C 21/005* (2013.01); *C23C 14/24* (2013.01);
(Continued)

(58) Field of Classification Search
None
See application file for complete search history.

(56) References Cited

U.S. PATENT DOCUMENTS 7,837,528 B2 * 11/2010 Shigemura .............. C23C 14/12
427/66
8,334,649 B2 * 12/2012 Shigemura .............. C23C 14/12
445/24
(Continued)

FOREIGN PATENT DOCUMENTS

| CN | 1238149 C | 1/2006 |
| CN | 102569673 A | 7/2012 |

(Continued)

OTHER PUBLICATIONS

Translation of Written Opinion of the ISA for PCT/CN2020/078723; dated Jun. 1, 2020.*
(Continued)

*Primary Examiner* — Jethro M. Pence
(74) *Attorney, Agent, or Firm* — Procopio, Cory, Hargreaves & Savitch LLP

(57) ABSTRACT

A mask has a mask pattern region and a non-mask pattern region located at a peripheral of the mask pattern region. The mask pattern region includes at least one effective mask region. In any effective mask region, the mask includes a plurality of evaporation holes and at least one shielding;
(Continued)

strip. Each shielding, strip is located between two adjacent evaporation holes. The mask has at least one welding region in the non-mask pattern region. A thickness of a portion of the mask in the non-mask pattern region and at least in the welding region is greater than a thickness of the shielding strip of the mask in the effective mask region, and the thickness refers to a dimension of the corresponding portion along a direction perpendicular to a plane where the mask is located.

12 Claims, 13 Drawing Sheets

(51) Int. Cl.
  *C23C 14/24* (2006.01)
  *C25D 1/10* (2006.01)
  *C25D 3/38* (2006.01)
  *C25D 3/54* (2006.01)
  *H10K 71/16* (2023.01)

(52) U.S. Cl.
  CPC ............. *C25D 1/10* (2013.01); *C25D 3/38* (2013.01); *C25D 3/54* (2013.01); *H10K 71/166* (2023.02)

(56) References Cited

U.S. PATENT DOCUMENTS

| | | | | |
|---|---|---|---|---|
| 8,628,620 B2* | 1/2014 | Kawato | ............... | C23C 14/042 118/504 |
| 8,646,405 B2* | 2/2014 | An | ............... | B05B 12/20 118/504 |
| 8,656,859 B2* | 2/2014 | Hong | ............... | H10K 71/166 118/504 |
| 8,746,169 B2* | 6/2014 | Lee | ............... | H10K 71/166 118/504 |
| 8,776,718 B2* | 7/2014 | Park | ............... | C23C 14/042 118/504 |
| 8,881,676 B2* | 11/2014 | Hong | ............... | H10K 71/00 118/504 |
| 8,881,677 B2* | 11/2014 | De | ............... | H01L 22/10 118/504 |
| 9,105,849 B2* | 8/2015 | Park | ............... | H10K 71/166 |
| 9,192,959 B2* | 11/2015 | Hong | ............... | C23F 1/02 |
| 9,337,374 B2* | 5/2016 | Kramer | ............... | H01L 31/188 |
| 9,340,876 B2* | 5/2016 | Kim | ............... | C23C 16/042 |
| 9,580,791 B2* | 2/2017 | Inoue | ............... | C23F 1/02 |
| 9,604,240 B2* | 3/2017 | Ko | ............... | C23C 14/042 |
| 9,666,837 B2* | 5/2017 | Lee | ............... | H10K 71/00 |
| 9,682,400 B2* | 6/2017 | Kim | ............... | C23C 14/042 |
| 9,711,724 B2* | 7/2017 | Baek | ............... | C23C 14/042 |
| 9,821,416 B2* | 11/2017 | Kim | ............... | B23K 37/0408 |
| 10,014,471 B2* | 7/2018 | Baek | ............... | C23F 1/02 |
| 10,439,170 B2* | 10/2019 | Lin | ............... | C23C 14/042 |
| 10,507,475 B2* | 12/2019 | Reichert | ............... | B30B 15/062 |
| 10,570,499 B2* | 2/2020 | Lin | ............... | H10K 71/164 |
| 10,625,289 B2* | 4/2020 | Gong | ............... | C23C 14/042 |
| 10,663,857 B2* | 5/2020 | Lv | ............... | C23C 14/12 |
| 10,711,338 B2* | 7/2020 | Kawato | ............... | C23C 14/042 |
| 10,774,415 B2* | 9/2020 | Lin | ............... | C23C 14/042 |
| 10,787,729 B2* | 9/2020 | Bai | ............... | C23C 14/24 |
| 10,787,731 B2* | 9/2020 | Xie | ............... | B05C 21/005 |
| 10,829,847 B2* | 11/2020 | Zhang | ............... | B23K 1/0008 |
| 10,865,473 B2* | 12/2020 | Liu | ............... | H10K 50/844 |
| 10,876,199 B2* | 12/2020 | Kishimoto | ............... | H05B 33/10 |
| 10,903,426 B2* | 1/2021 | Fujito | ............... | B05C 21/005 |
| 10,947,620 B2* | 3/2021 | Wang | ............... | C23C 16/042 |
| 11,038,154 B2* | 6/2021 | Kishimoto | ............... | C23C 14/042 |
| 11,041,237 B2* | 6/2021 | Takeda | ............... | B23K 26/40 |
| 11,066,737 B2* | 7/2021 | Li | ............... | B05C 21/005 |
| 11,075,340 B2* | 7/2021 | Shin | ............... | C23F 4/00 |
| 11,136,662 B2* | 10/2021 | Luo | ............... | H10K 71/166 |
| 11,149,341 B2* | 10/2021 | Zhang | ............... | B05C 21/005 |
| 11,154,901 B2* | 10/2021 | Stilin | ............... | B05B 12/24 |
| 11,203,808 B2* | 12/2021 | Zhu | ............... | C23C 14/12 |
| 11,207,705 B2* | 12/2021 | Gong | ............... | B05C 21/005 |
| 11,279,999 B2* | 3/2022 | Aoki | ............... | C23C 14/24 |
| 11,396,693 B2* | 7/2022 | Bai | ............... | B05C 21/005 |
| 11,414,739 B2* | 8/2022 | Lin | ............... | C23C 14/12 |
| 11,434,559 B2* | 9/2022 | Aoki | ............... | C23C 14/042 |
| 11,538,993 B2* | 12/2022 | Ding | ............... | H10K 71/00 |
| 11,542,588 B2* | 1/2023 | Lv | ............... | H10K 71/166 |
| 11,560,616 B2* | 1/2023 | Bai | ............... | C23C 14/042 |
| 11,566,322 B2* | 1/2023 | Huang | ............... | H10K 50/844 |
| 11,566,323 B2* | 1/2023 | Huang | ............... | G06F 1/189 |
| 11,572,616 B2* | 2/2023 | Luo | ............... | B05C 21/005 |
| 11,608,554 B2* | 3/2023 | Aoki | ............... | H10K 71/166 |
| 11,638,388 B2* | 4/2023 | Dong | ............... | H10K 71/233 118/504 |
| 11,706,968 B2* | 7/2023 | Fujito | ............... | C23F 1/28 |
| 11,732,347 B2* | 8/2023 | Okamoto | ............... | C23C 14/54 118/712 |
| 11,733,607 B2* | 8/2023 | Ikenaga | ............... | G03F 7/0015 430/312 |
| 11,746,406 B2* | 9/2023 | Yang | ............... | B05C 21/005 118/721 |
| 2011/0168087 A1 | 7/2011 | Lee et al. | | |
| 2012/0156812 A1 | 6/2012 | Ko et al. | | |
| 2014/0335688 A1 | 11/2014 | Ko | | |
| 2016/0026089 A1 | 1/2016 | Chen | | |
| 2016/0043319 A1* | 2/2016 | White | ............... | H10K 71/191 359/230 |
| 2017/0104158 A1* | 4/2017 | Kawato | ............... | H10K 71/00 |
| 2018/0138408 A1* | 5/2018 | Lassiter | ............... | C23C 14/56 |
| 2018/0148823 A1 | 5/2018 | Yoo et al. | | |
| 2018/0155818 A1* | 6/2018 | Mu | ............... | C23C 14/042 |
| 2018/0209029 A1 | 7/2018 | Lin et al. | | |
| 2018/0216220 A1* | 8/2018 | Lv | ............... | C23C 14/042 |
| 2019/0036026 A1* | 1/2019 | Huang | ............... | C25D 1/10 |
| 2019/0036027 A1* | 1/2019 | Lassiter | ............... | C23C 14/042 |
| 2019/0100834 A1 | 4/2019 | Sakio et al. | | |
| 2019/0144987 A1* | 5/2019 | Guo | ............... | C23C 14/24 118/504 |
| 2019/0352113 A1* | 11/2019 | Nakamura | ............... | B65H 5/222 |
| 2019/0360087 A1* | 11/2019 | Esumi | ............... | C23C 14/12 |
| 2021/0054494 A1* | 2/2021 | Ding | ............... | C23C 14/042 |
| 2021/0071289 A1* | 3/2021 | Kishimoto | ............... | H10K 71/00 |
| 2021/0214834 A1* | 7/2021 | Huang | ............... | C23C 14/042 |
| 2021/0273207 A1* | 9/2021 | Kishimoto | ............... | H05B 33/10 |
| 2021/0336147 A1* | 10/2021 | Ye | ............... | H10K 71/164 |
| 2021/0404079 A1* | 12/2021 | Xiao | ............... | H10K 71/00 |
| 2022/0002858 A1* | 1/2022 | Jiang | ............... | B05C 21/005 |
| 2022/0123068 A1* | 4/2022 | Zheng | ............... | H10K 59/88 |
| 2022/0127712 A1* | 4/2022 | Han | ............... | C23C 14/042 |
| 2022/0205076 A1* | 6/2022 | Niu | ............... | C23C 14/042 |
| 2022/0216412 A1* | 7/2022 | Zhang | ............... | H10K 71/166 |
| 2022/0259714 A1* | 8/2022 | Zang | ............... | C23C 14/042 |
| 2022/0307120 A1* | 9/2022 | Cai | ............... | C23C 14/042 |
| 2022/0316043 A1* | 10/2022 | Xue | ............... | H10K 50/81 |
| 2022/0372615 A1* | 11/2022 | Pan | ............... | C23C 16/042 |
| 2023/0079712 A1* | 3/2023 | Li | ............... | H10K 71/166 118/720 |
| 2023/0085315 A1* | 3/2023 | Bi | ............... | B23P 15/00 118/721 |

FOREIGN PATENT DOCUMENTS

| | | |
|---|---|---|
| CN | 103713466 A | 4/2014 |
| CN | 103894758 A | 7/2014 |
| CN | 104152845 A | 11/2014 |
| CN | 105734488 A | 7/2016 |
| CN | 106086782 A | 11/2016 |
| CN | 206616264 U | 11/2017 |
| CN | 108118289 A | 6/2018 |
| CN | 108779553 A | 11/2018 |
| CN | 108823527 A | 11/2018 |
| CN | 108866475 A | 11/2018 |
| CN | 108998773 A | 12/2018 |
| CN | 109023237 A | 12/2018 |

(56) References Cited

FOREIGN PATENT DOCUMENTS

| | | |
|---|---|---|
| CN | 109778116 A | 5/2019 |
| JP | 2006092752 A | 4/2006 |
| JP | 2018138698 A | 9/2018 |

OTHER PUBLICATIONS

Office Action dated Aug. 20, 2020 from corresponding CN Patent Application No. 201910244878.2, 17 pages.
Office Action dated Dec. 9, 2020 from corresponding CN Patent Application No. 201910244878.2, 15 pages.
Notification to Grant Patent Right for Invention dated Feb. 4, 2021 from corresponding CN Patent Application No. 201910244878.2, 8 pages.

\* cited by examiner

«MASK AND METHOD OF MANUFACTURING THE SAME, AND MASK ASSEMBLY»

CROSS-REFERENCE TO RELATED APPLICATIONS

This application is a national phase entry under 35 USC 371 of international Patent Application No. PCT/CN2020/078723 filed on Mar. 11, 2020, which claims priority to Chinese Patent Application No. 201910244878.2, filed on Mar. 28, 2019, which are incorporated herein by reference in their entirety.

TECHNICAL FIELD

The embodiments of the present disclosure relate to a mask and a method of manufacturing the same, and a mask assembly.

BACKGROUND

In the manufacturing process of electronic products, masks are often used to form film layers with various patterns. For example, the use of a mask can realize evaporation of an organic light-emitting layer in an organic light-emitting diode (OLED) display device.

SUMMARY

In one aspect, a mask is provided. The mask has a mask pattern region and a non-mask pattern region located at a peripheral of the mask pattern region. The mask pattern region includes at least one effective mask region. In any effective mask region, the mask includes: a plurality of evaporation holes and at least one shielding strip. Each shielding strip is located between two adjacent evaporation holes. The mask has at least one welding region in the non-mask pattern region. A thickness of a portion of the mask in the non-mask pattern region and at least in a welding region is greater than a thickness of the shielding strip of the mask in the effective mask region. The thickness refers to a dimension of a corresponding portion along a direction perpendicular to a plane where the mask is located.

In some embodiments, the mask pattern region includes two or more effective mask regions. In the mask pattern region, the mask includes at least one space portion. Each space portion is located between two adjacent effective mask regions. A thickness of the space portion is the same as the thickness of the shielding strip.

In some embodiments, the mask includes a first metal layer and a second metal layer stacked with the first metal layer along a thickness direction of the mask. The first metal layer at least includes the shielding strip in the effective mask region, and the first metal layer covers the non-mask pattern region. The second metal layer is located in the non-mask pattern region, and at least covers a portion of the first metal layer located in the at least one welding region.

In some embodiments, the second metal layer covers a portion of the first metal layer located in the non-mask pattern region.

In some embodiments, the non-mask pattern region includes a transition region adjacent to the mask pattern region. A thickness of the mask in the transition region gradually increases from a first thickness to a second thickness along a first direction. The first direction points from a side of the transition region where the transition region is connected to the mask pattern region to a side of the transition region away from the mask pattern region.

In some embodiments, the first thickness is equal to the thickness of the shielding strip. The second thickness is equal to a sum of the thickness of the shielding strip and a thickness of a portion of the second metal layer outside the transition region.

In some embodiments, the at least one welding region is arranged in the following way: the at least one welding region and the transition region do not overlap; and/or, the number of the at least one welding region is two, and the two welding regions are located at opposite sides of the mask pattern region.

In some embodiments, a width range of the transition region along the first direction is approximately 1 μm to approximately 8 μm.

In some embodiments, the mask pattern region is substantially rectangular. A width range of a portion of the transition region, which is located at opposite sides of the rectangle along a width direction of the rectangle, along the first direction is approximately 1 μm to approximately 3 μm; and/or, a width range of the portion of the transition region, which is located at opposite sides of the rectangle along a length direction of the rectangle, along the first direction is approximately 3 μm to approximately 8 μm.

In some embodiments, a thickness range of the portion of the mask in the non-mask pattern region outside the transition region is approximately 20 μm to approximately 30 μm.

In some embodiments, a material of the second metal layer includes at least one of copper and tungsten.

In some embodiments, a thickness range of the first metal layer is approximately 3 μm to approximately 10 μm.

In some embodiments, a thickness range of the shielding strip of the mask in the effective mask region is approximately 3 μm to approximately 10 μm.

In another aspect, a mask assembly is provided. The mask assembly includes: a frame in which an opening is disposed, and at least one mask as described in any of the above embodiments. Each mask spans the opening, and is welded to the frame in the at least one welding region.

In yet another aspect, a method of manufacturing a mask is provided. The mask has a mask pattern region and a non-mask pattern region located at the peripheral of the mask pattern region. The mask pattern region includes at least one effective mask region. The mask has at least one welding region in the non-mask pattern region. The method includes: forming a first metal layer, and forming a second metal layer on a side of the first metal layer. The first metal layer extends from the mask pattern region to the non-mask pattern region, and covers the non-mask pattern region. In any effective mask region, the first metal layer includes a plurality of evaporation holes and at least one shielding strip, and each shielding strip is located between two adjacent evaporation holes. The second metal layer is located in the non-mask pattern region, and at least covers a portion of the first metal layer located in the at least one welding region; and a thickness of a portion of the mask in the non-mask pattern region and at least in the welding region is greater than a thickness of the shielding strip of the mask in the effective mask region.

In some embodiments, the step of forming a second metal layer on a side of the first metal layer, includes: forming a first adhesive layer on a side of the first metal layer; forming the second metal layer on the first metal layer on which the first adhesive layer has been formed through an electroforming process; and removing the first adhesive layer. The first adhesive layer at least covers a portion of the first metal layer other than the evaporation holes in the mask pattern region. The second metal layer covers an exposed surface of the first metal layer in the non-mask pattern region.

In some embodiments, the step of forming a first adhesive layer on a side of the first metal layer, includes: providing a mold on a side of the first metal layer; forming the first adhesive layer on the first metal layer on which the mold has been disposed; and removing the mold and retaining the first adhesive layer. The mold is located in the non-mask pattern region, and at least covers a transition region of the non-mask pattern region that is adjacent to the mask pattern region. A thickness of the mold in the transition region gradually increases from 0 to H along a first direction; a range of H is approximately 10 μm to approximately 27 μm. A width range of the transition region along the first direction is approximately 1 μm to approximately 3 μm; and the first direction points from a side of the transition region where the transition region is connected to the mask pattern region to a side of the transition region away from the mask pattern region. The first adhesive layer includes: a main adhesive layer pattern covering the portion of the first metal layer other than the evaporation holes in the mask pattern region, and an extending adhesive layer pattern extending to the transition region; and the extending adhesive layer pattern covers a portion of the mold located in the transition region.

In some embodiments, the step of forming the second metal layer on the first metal layer on which the first adhesive layer has been formed through an electroforming process, includes: placing the first metal layer on which the first adhesive layer has been formed in an electroforming liquid having at least one of copper ion or tungsten ion to perform electroforming, so as to form the second metal layer containing at least one of copper or tungsten.

BRIEF DESCRIPTION OF THE DRAWINGS

In order to describe technical solutions in the present disclosure more clearly, accompanying drawings to be used in some embodiments of the present disclosure will be introduced briefly. Obviously, the accompanying drawings to be described below are merely accompanying drawings of some embodiments of the present disclosure, and a person of ordinary skill in the art can obtain other drawings according to these drawings. In addition, the accompanying drawings to be described below may be regarded as schematic diagrams, and are not limitations on actual dimensions of products, actual processes of methods and actual timings of signals that the embodiments of the present disclosure relate to.

DETAILED DESCRIPTION

Figure 1A:
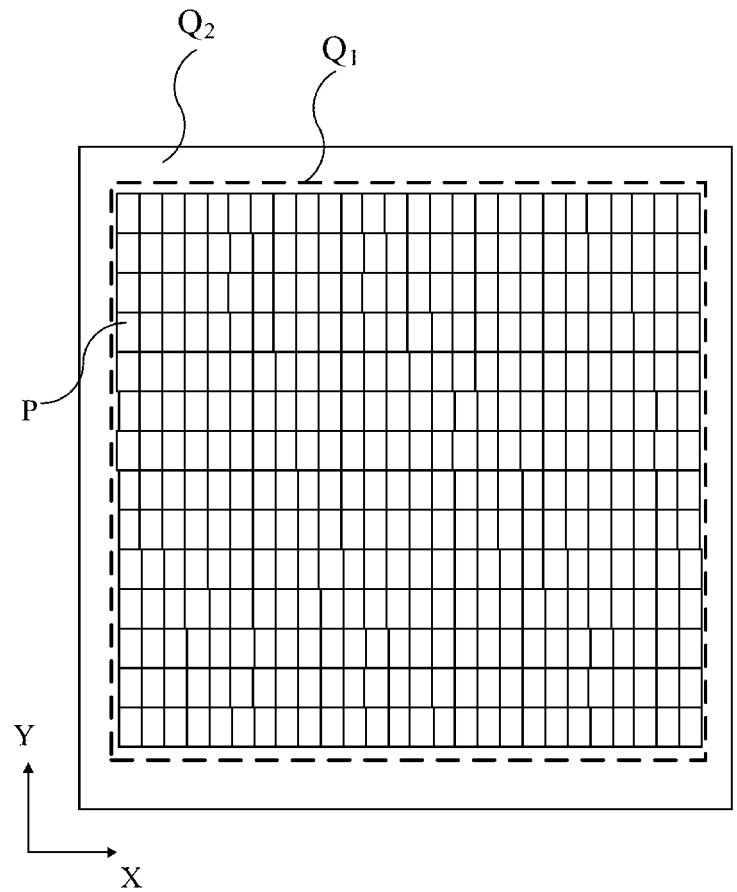
FIG. 1a is a diagram showing a structure of a display panel, in accordance with some embodiments of the present disclosure.

Technical solutions in some embodiments of the present disclosure will be described clearly and completely in combination with accompanying drawings below. Obviously, the described embodiments are merely some but not all embodiments of the present disclosure. All other embodiments obtained on a basis of the embodiments of the present disclosure by a person of ordinary skill in the art shall be included in the protection scope of the present disclosure.

Unless the context requires otherwise, the term "comprise" and other forms thereof such as the third-person singular form "comprises" and the present participle form "comprising" are construed as an open and inclusive meaning, i.e., "included, but not limited to". In the description of the specification, terms such as "one embodiment", "some embodiments", "exemplary embodiments", "example", "specific example", or "some examples" are intended to indicate that specific features, structures, materials or characteristics related to the embodiment(s) or the example(s) are included in at least one embodiment or example of the present disclosure. Schematic representations of the above terms do not necessarily refer to the same embodiment or example. In addition, the specific features, structures, materials or characteristics may be included in any one or more embodiments or examples in any suitable manner.

In the following, the phrase "at least one of A. B, and C" has a same meaning as the phrase "at least one of A, B or C", and both include the following combinations of A, B, and C: only A, only B, only C, a combination of A and B, a combination of A and C, a combination of B and C, and a combination of A, B, and C. Phrase "A and/or B", however, includes the following three combinations: only A, only B, and a combination of A and B.

Unless otherwise defined, technical terms or scientific terms used in the embodiments of the present disclosure shall be understood as ordinary meanings by a person of ordinary skill in the field that the present disclosure belongs to. Terms "first", "second" and the like used in the embodiments of the present disclosure are not intended to mean any order, quantity or importance, and are merely used to distinguish different components. A word such as "include" or "comprise" means that the element or item appearing before the word covers the element or item appearing after the word and the equivalent thereof without excluding other elements or items. A word such as "connect", "couple" or "link" is not limited to physical or mechanical connections, but may include electrical connection, whether direct or indirect. "Upper", "lower", "left", "right", etc. are only used to indicate a relative positional relationship, and when the absolute position of the described object is changed, the relative positional relationship may also be changed accordingly. In addition, in the description of the embodiments of the present disclosure, the term "a/the plurality of" means two or more unless otherwise specified.

In some embodiments of the present disclosure, the application of a mask in a manufacturing process of an organic light-emitting diode (OLED) display panel is used as an example for description.

The OLED display panel has received widespread attention due to its advantages such as self-luminescence, lightness and thinness, low power consumption, high contrast, high color gamut, and flexible display, and the OLED display panel is also known as a new generation of display technology. The OLED display panel may be applied to an OLED display device. For example, the OLED display device may be any product or component having a display function, such as a mobile phone, a tablet computer, a television, a display, a notebook computer, a digital camera, or a navigator.

As shown in FIG. 1a, an OLED display panel PNL includes: an active area $Q_1$ (also known as AA region) and a peripheral area $Q_2$ disposed around the active area Sub-pixels P with a plurality of colors are arranged in the AA region, and the sub-pixels with the plurality of colors at least include a first color sub-pixel, a second color sub-pixel, and a third color sub-pixel. The first color, the second color, and the third color are three primary colors (e.g., red, green and blue). For convenience of description, the embodiments of the present disclosure are described by taking an example in which the sub-pixels P are arranged in a matrix.

In this case, sub-pixels P arranged in a row direction X are referred to as sub-pixels in a same row, and sub-pixels P arranged in a column direction Y are referred to as sub-pixels in a same column. The sub-pixels in a same row may be connected to a gate line, and the sub-pixels in a same column may be connected to a data line.

Figure 1B:
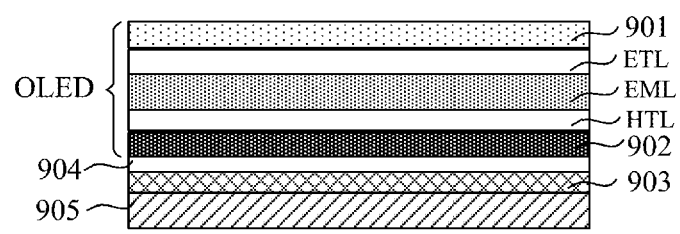
FIG. 1b is a diagram showing a structure of a sub-pixel in an OLED display panel, in accordance with some embodiments of the present disclosure.

For a single sub-pixel, as shown in FIG. 1b, an organic light-emitting diode (OLED) and a pixel driving circuit 903 that controls the OLED to emit light are disposed in the sub-pixel P.

Referring to FIG. 1b, the OLED includes a cathode 901, an anode 902, and a light-emitting functional layer located between the cathode 901 and the anode 902. The light-emitting functional layer may include an organic light-emitting layer EML, a hole transport layer HTL located between the organic light-emitting layer EML and the anode 902, and an electron transport layer ETL located between the organic light-emitting layer EML and the cathode 901. Of course, according to needs, in some embodiments, a hole injection layer may be disposed between the hole transport layer NIL and the anode 902, and an electron injection layer may be disposed between the electron transport layer ETL and the cathode 901.

During display, by controlling voltages applied to the anode 902 and the cathode 901, holes are injected by the anode 902, electrons are injected by the cathode 901, and then the electrons and holes meet in the organic light-emitting layer EML to generate excitons, and thereby the organic light-emitting layer EML is excited to emit light.

The pixel driving circuit 903 is generally composed of electronic devices such as a thin film transistor (TFT for short) and a capacitor (C for short). For example, the pixel driving circuit 903 may be a pixel driving circuit having a 2T1C structure composed of two thin film transistors (e.g., a switch TFT and a driving TFT) and a capacitor. Of course, the pixel driving circuit 903 may also be a pixel driving circuit composed of more than two thin film transistors (e.g., a plurality of switch TFTs and a driving TFT) and at least one capacitor. Regardless of the structure of the pixel driving circuit 903, the driving TFT should be included, and the driving TFT may be coupled to the anode 902 of the OLED.

It will be noted that FIG. 1b is only a schematic diagram, and does not show a connection relation between the pixel driving circuit (in practice, a suitable pixel driving circuit may be selected according to needs) and the OLED. A person skilled in the art may understand that the driving TFT in the pixel driving circuit 903 may be coupled to the anode 902 of the OLED through a through hole in an insulating layer 904 that is located on the pixel driving circuit 903. In addition, for example, FIG. 1b also shows a base 905, and the pixel driving circuit 903 may be directly or indirectly manufactured on the base 905.

In an example where the organic light-emitting layer EML in the OLED display panel PNL is manufactured, a mask assembly may be used to manufacture the organic light-emitting layer EML through an evaporation process.

Figure 2:
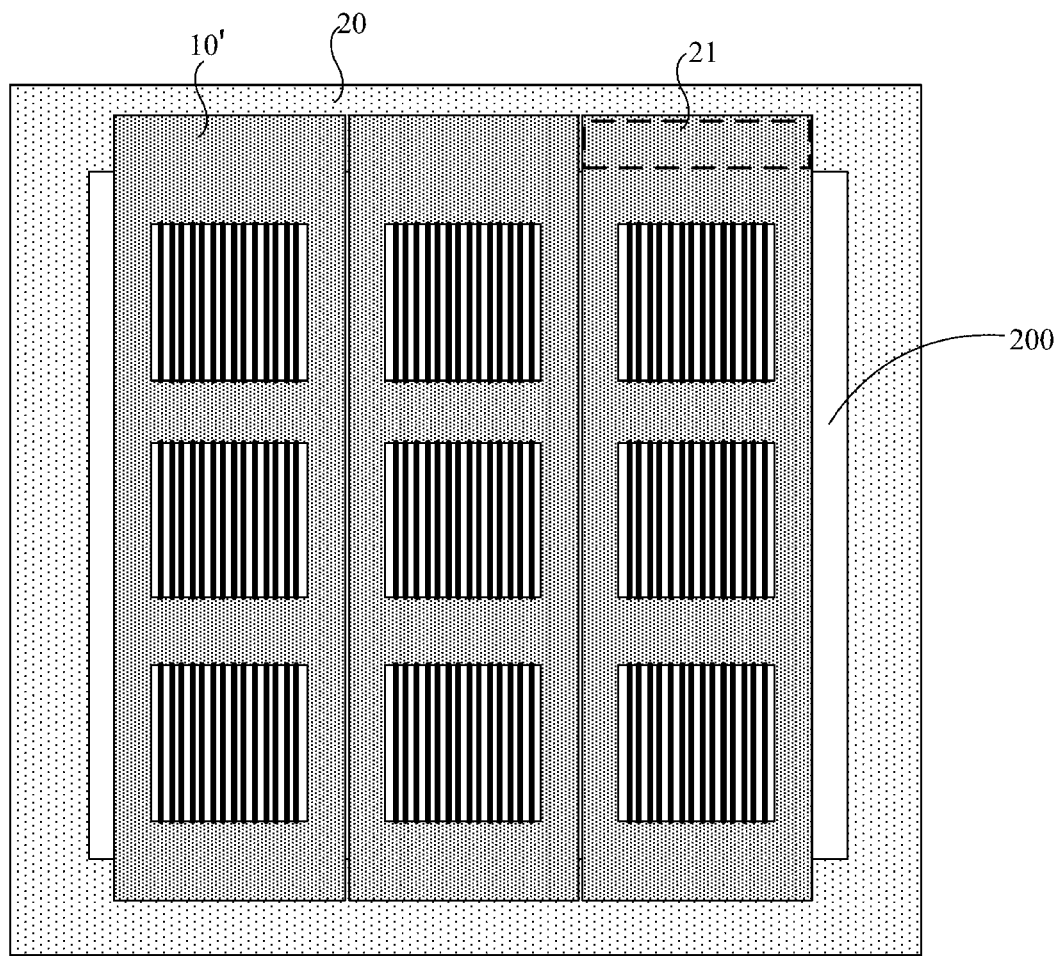
FIG. 2 is a diagram showing a structure of a mask assembly, in accordance with some embodiments of the present disclosure.

Some embodiments of the present disclosure provide a mask assembly A'. As shown in FIG. 2, the mask assembly A' includes a frame 20 and at least one mask 10' (not limited to three masks 10' in FIG. 2). An opening 200 is formed in the frame 20. Each mask 10' spans the opening 200, and is welded to the frame 20 in welding region(s) 21. When there are a plurality of masks 10', the plurality of masks 10' may be arranged in parallel and welded to the frame 20 in welding regions 21.

During the assembly process of the mask assembly A', it needs to tension the mask 10' first to make it stretch and span the opening 200 of the frame 20. In this case, a portion of the mask 10' in the welding region 21 is in contact with the frame 20, and then the portion is welded to the frame 20. For example, a laser welding manner is used to manufacture the mask assembly A'.

It will be noted that, a specific position, size, shape, etc. of the welding region 21 in the mask 10' may be arranged according to a shape of the mask 10' and a shape of the frame 20 in combination with actual needs, which is not limited by the embodiments of the present disclosure.

In addition, FIG. 2 is only an illustration of the mask assembly A', and a person skilled in the art may understand that in addition to the frame 20 and the plurality of masks 10', the mask assembly A' may further include other components. For example, the mask assembly A' further includes a cover strip that spans the opening 200 of the frame 20 and is located at a position of a gap between two adjacent masks 10', and the cover strip is used to prevent evaporation materials from being evaporated onto a substrate through the gap. For another example, the mask assembly A' further includes supporting strips that span the opening 200 of the frame 20 and cross the cover strips, and the supporting strips are used to support the masks 10' to prevent deformation of the masks 10'.

Figure 3:
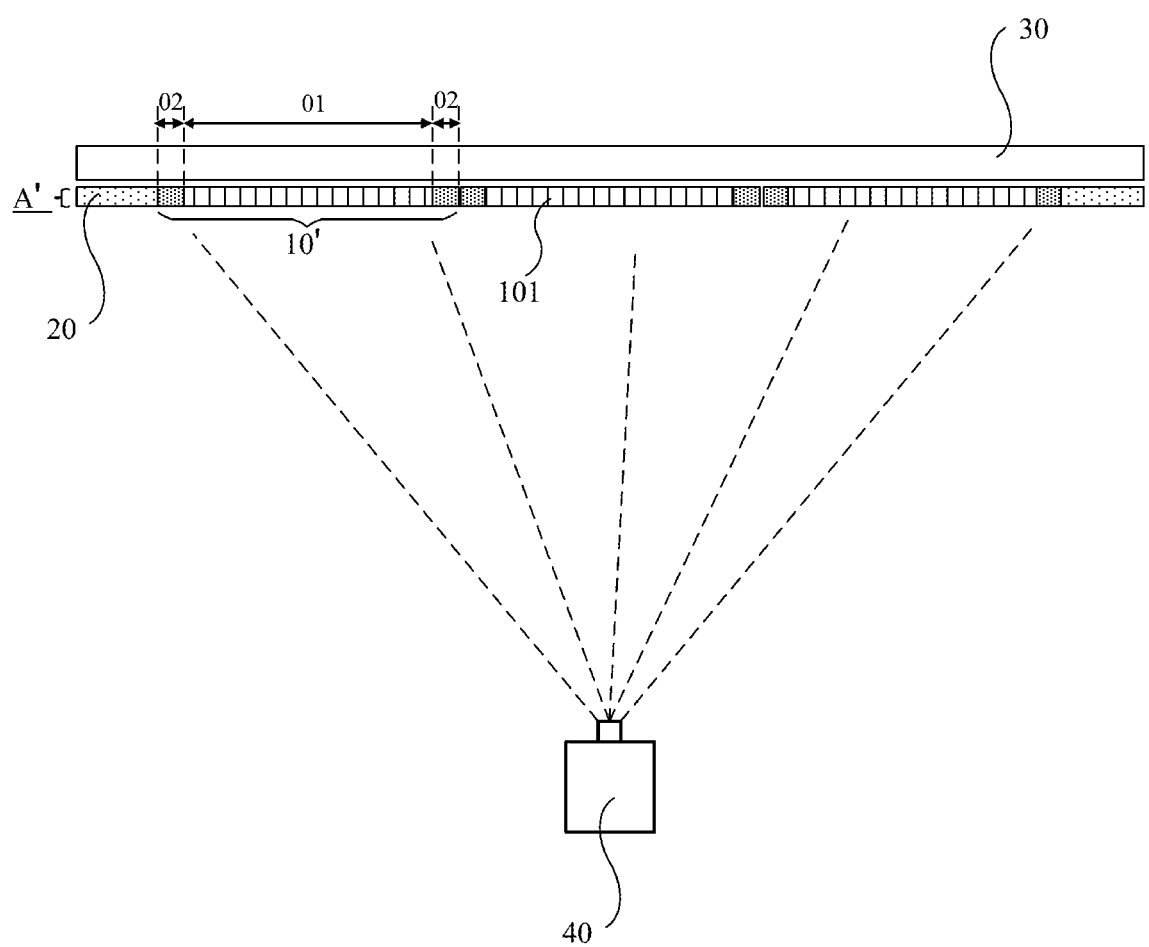
FIG. 3 is a schematic diagram showing a mask assembly in an evaporation process, in accordance with some embodiments of the present disclosure.

As shown in FIG. 3, during evaporation, the mask assembly A' is placed between a substrate 30 (in the substrate 30, a region corresponding to each sub-pixel P is provided with a pixel driving circuit, an anode and other components) and an evaporation source 40, so that organic evaporation materials in the evaporation source 40 can pass through evaporation holes 101 in the mask 10' to be evaporated to the corresponding sub-pixels in the substrate 30.

Figure 4:
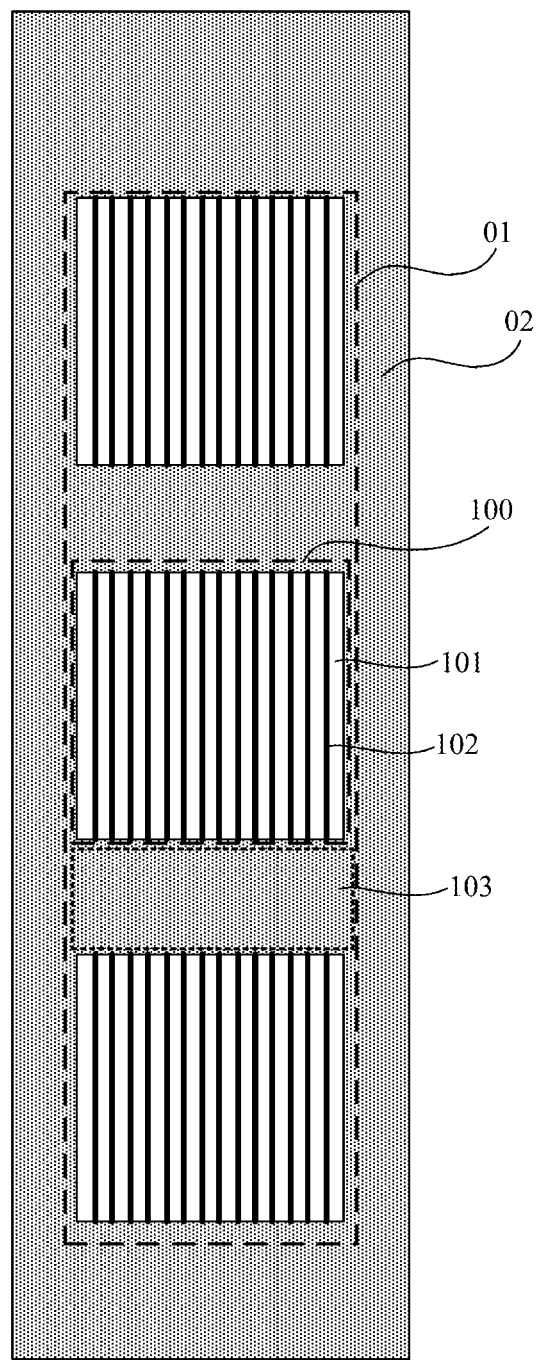
FIG. 4 is a diagram showing a structure of a mask, in accordance with some embodiments of the present disclosure.

As shown in FIGS. 3 and 4, the mask 10' in the mask assembly A' has a mask pattern region 01 and a non-mask pattern region 02 located at a peripheral of the mask pattern region 01. In addition, the mask pattern region 01 is provided with an effective mask region 100 in one-to-one correspondence with each display panel PNL (not limited to three effective mask regions 100 in FIG. 4). In a case where the mask pattern region 01 is provided with a plurality of effective mask regions 100, two adjacent effective mask regions 100 are separated by a space portion 103.

It will be understood that in the case where the mask pattern region 01 includes the plurality of effective mask regions 100, the mask 10' may be used to manufacture a display panel motherboard. After the display panel motherboard is cut, a plurality of independent display panels PNL may be obtained.

As shown in FIG. 4, a plurality of evaporation holes 101 are disposed in the effective mask region 100, and a shielding strip 102 is located between two adjacent evaporation holes 101. In some examples, one evaporation hole may correspond to one sub-pixel P in the display panel PNL. In other examples, however, one evaporation hole (e.g., the evaporation holes 101 shown in FIG. 4) may correspond to a column of sub-pixels P in the display panel PNL.

The mask 10' has the same thickness at every position, and is relatively thin. As mentioned above, in a case where the mask 10' is used to form a patterned film layer (such as the organic light-emitting layer EML), it is often necessary to tension the mask and weld it to the frame. However, the inventors of the present disclosure have discovered through study that since the overall thickness of the mask 10' is relatively small, the energy of the laser is difficult to control when laser is used for welding. In this case, if the energy of the laser is excessively large, it is easy to cause a welding through phenomenon; and if the energy of the laser is excessively small, it is easy to cause a pseudo welding phenomenon.

Figure 5:
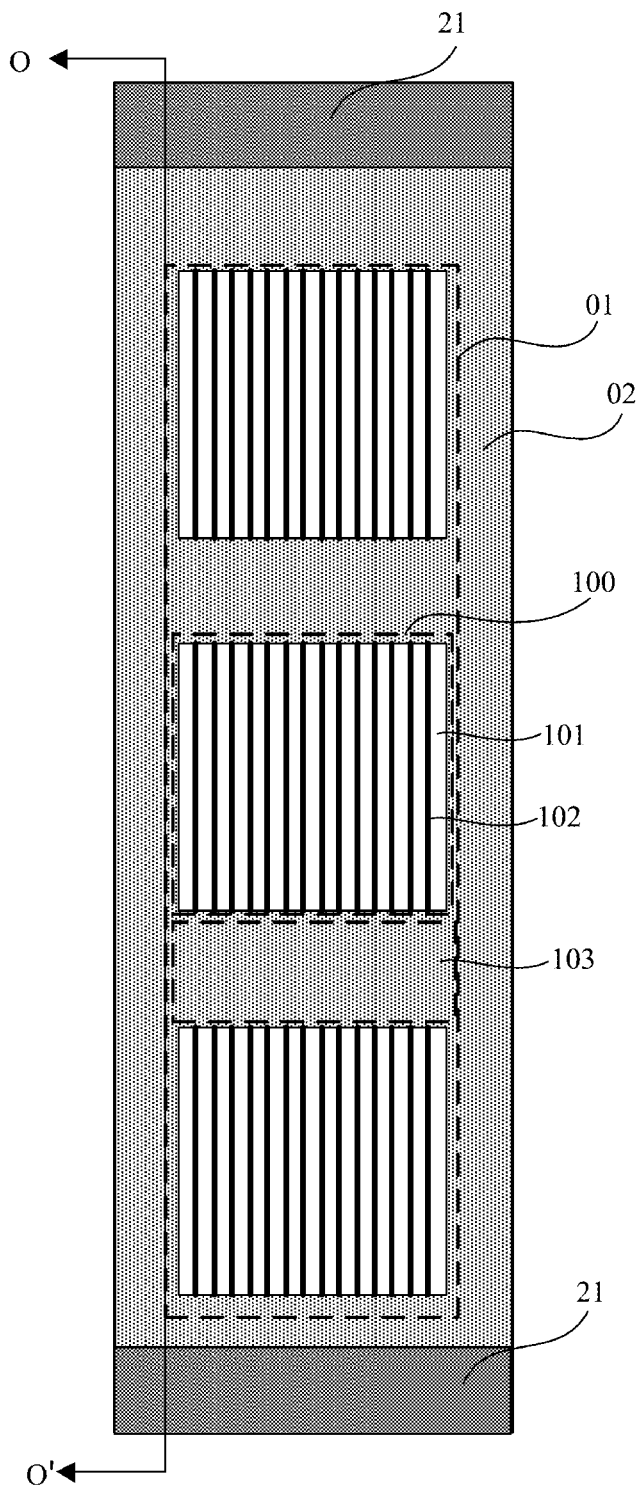
FIG. 5 is a diagram showing a structure of another mask, in accordance with some embodiments of the present disclosure.

In view of this, on the basis of the above, some embodiments of the present disclosure provide another mask 10. Referring to FIG. 5, the mask 10 has a mask pattern region 01 and a non-mask pattern region 02 located at a peripheral of the mask pattern region 01. For example, in FIG. 5, the non-mask pattern region 02 may be disposed around the mask pattern region 01. In addition, the mask pattern region 01 includes at least one effective mask region 100. In any effective mask region 100, the mask 10 includes a plurality of evaporation holes 101 and a shielding strip 102 located between two adjacent evaporation holes 101.

Figure 6:
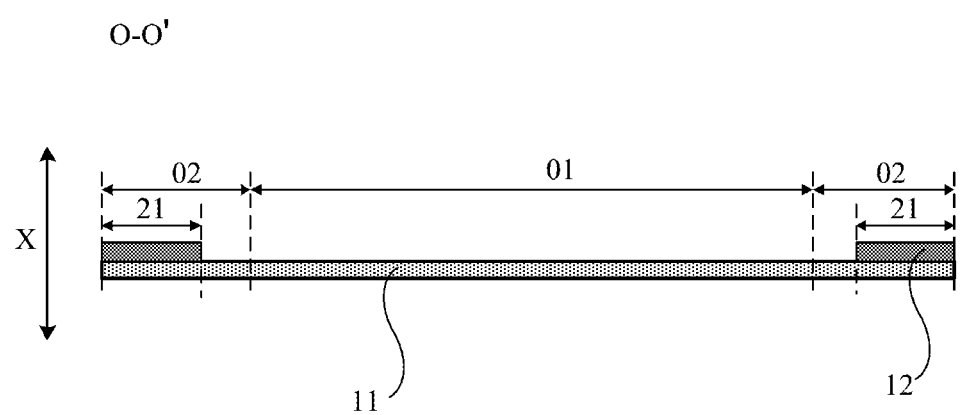
FIG. 6 is a section of the mask in FIG. 5 taken along direction O-O'.

The mask 10 has welding region(s) 21 in the non-mask pattern region 02, and a thickness of a portion of the mask 10 in the non-mask pattern region 02 and at least in the welding region 21 is greater than a thickness of the shielding strip 102 of the mask 10 in the effective mask region 01. That is, compared with the mask 10' shown in FIG. 4, in the present embodiment, the thickness of the mask 10 in the welding region 21 of the non-mask pattern region 02 is larger. It will be noted that, the thickness in the embodiments of the present disclosure refers to a dimension of a corresponding part along a direction perpendicular to a plane where the mask 10 is located (e.g., a thickness direction X as shown in FIG. 6). For example, the thickness of the mask 10 in the welding region refers to a dimension of the mask 10 along the direction perpendicular to the plane where the mask is located; and the thickness of the shielding strip 102 refers to a dimension of the shielding strip 102 along the direction perpendicular to the plane where the mask is located.

Compared with a workpiece (film material) with a small welding thickness, the welding process for a workpiece (film material) with a large thickness is easier to be controlled, and the reliability of the welding is higher. Therefore, in the present embodiments, by increasing the thickness of the mask 10 in the welding region 21, when the mask 10 and the frame 20 are welded, the problem that welding failures (the welding through phenomenon, the pseudo welding phenomenon, etc.) are caused by the fact that the energy of the laser is difficult to control due to a small thickness of the mask 10 in the welding region 21 is improved, and the welding reliability of the mask 10 is enhanced.

In addition, since the thickness of the shielding strip 102 of the mask 10 is small in the effective mask region 100, accuracy of the mask 10 is high, so that the mask 10 may also be used to evaporate film layers with finer patterns.

For example, as shown in FIG. 5, the mask pattern region 01 includes two or more effective mask regions 100. In the mask pattern region 01, the mask 10 includes a space portion 103 located between two adjacent effective mask regions 100. A thickness of the space portion 103 may be the same as or different from the thickness of the shielding strip 102. For example, in a case where the thickness of the space portion 103 is the same as the thickness of the shielding strip 102, the mask 10 is easy to be manufactured; in a case where the thickness of the space portion 103 is less than the thickness of the shielding strip 102, the accuracy of the mask 10 is high; and in a case where the thickness of the space portion 103 is greater than the thickness of the shielding strip 102, it is beneficial to improve the overall structural strength of the mask 10, so that the mask 10 is not easy to deform, and has higher stability and reliability.

In some embodiments, in combination with FIGS. 5 and 6 (FIG. 6 is a section of FIG. 5 taken along direction O-O'), the mask 10 includes a first metal layer 11 and a second metal layer 12 that are sequentially stacked along the thickness direction X of the mask 10.

The first metal layer 11 at least includes the shielding strip 102 and the space portion 103 in the mask pattern region 01. That is, the shielding strip 102 and the space portion 103 of the mask 10 in the mask pattern region 01 belong to a part of the first metal layer 11. Moreover, the first metal layer 11 covers the non-mask pattern region 02. For example, the thickness of the first metal layer 11 in the effective mask region 01 is the same as the thickness of the first metal layer 11 in the non-mask pattern region 02. That is, the thickness of the shielding strip 102 in the present example is the same as the thickness of the space portion 103.

It will be noted that, the first metal layer 11 may be formed through an electroforming process, and a material of the first metal layer 11 may be nickel-iron alloy, and may also contain one or more of trace elements such as silicon, manganese, titanium, oxygen, carbon, and phosphorus.

For example, a thickness range of the first metal layer 11 is approximately 3 μm to approximately 10 μm. For example, the first metal layer 11 may be 3 μm, 5 μm, or 10 μm. Herein, "approximately" means that the thickness range of the first metal layer 11 may fluctuate by ten percent. For example, the thickness of the first metal layer 11 may be 2.7 μm, 10.5 μm, or 11 μm.

The second metal layer 12 is located in the non-mask pattern region 02, and at least covers a portion of the first metal layer 11 located in the welding region(s) 21.

For example, the second metal layer 12 is formed on a side of the first metal layer 11 and in the welding regions 21 through the electroforming process. In this case, the second metal layer 12 only covers the portion of the first metal layer 11 located in the welding regions 21, so that the thickness of the mask 10 in the welding region 21 may be increased, which is beneficial to meet the welding requirement. For example, a thickness range of the second metal layer 12 is approximately 10 μm to approximately 27 μm. For example, the second metal layer 12 may be 10 μm, 20 μm, or 27 μm. Herein, "approximately" means that the thickness range of the second metal layer 12 may fluctuate by ten percent. For example, the thickness of the second metal layer 12 may be 0.9 μm, 27.3 μm, or 29.7 μm.

Figure 7:
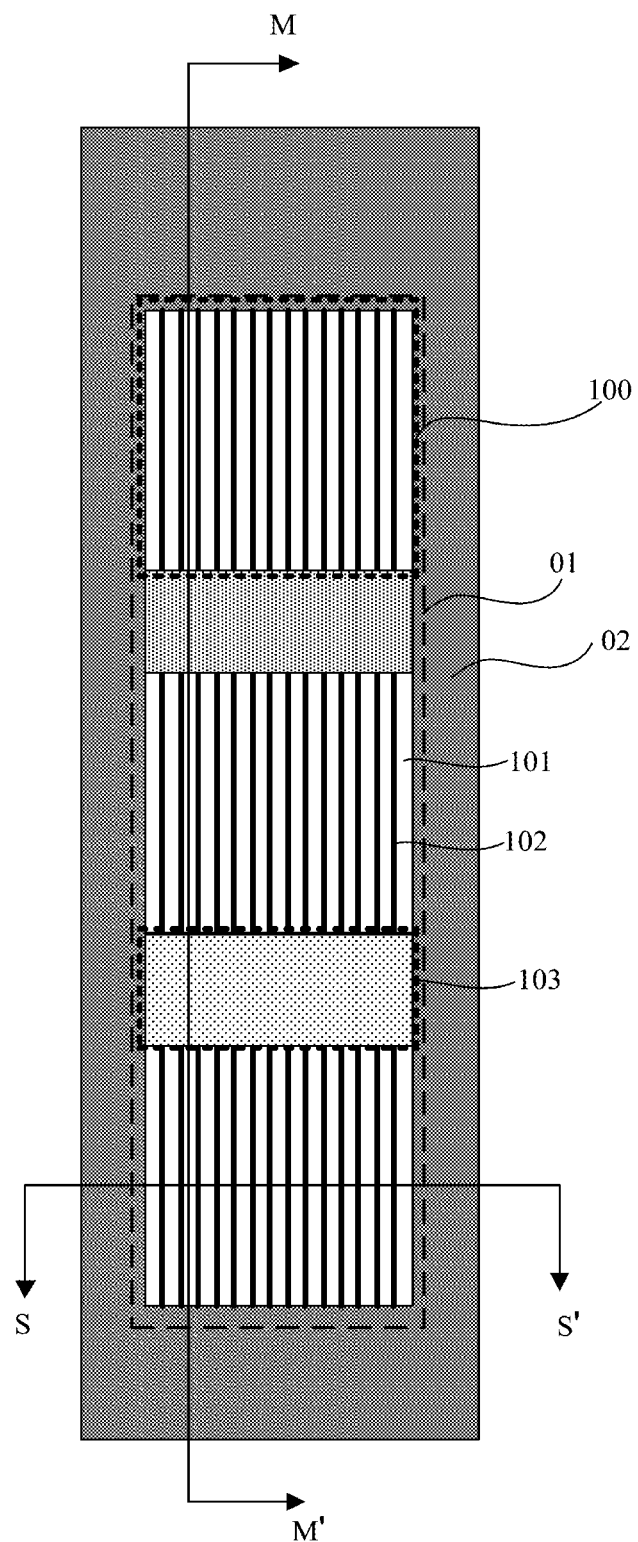
FIG. 7 is a diagram showing a structure of yet another mask, in accordance with some embodiments of the present disclosure.
Figure 8:
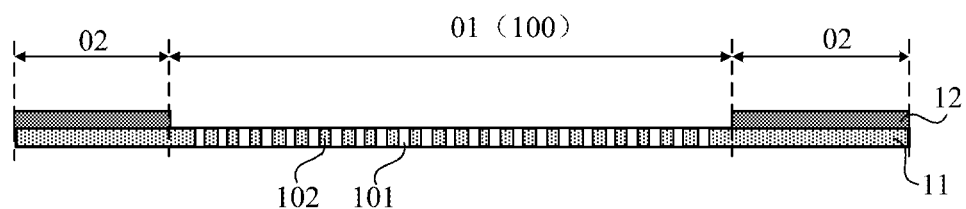
FIG. 8 is a section of the mask in FIG. 7 taken along direction S-S'.

For another example, in combination with FIGS. 7 and 8 (FIG. 8 is a section of FIG. 7 taken along direction S-S'), the second metal layer 12 is formed on a side of the first metal layer 11 and in the entire non-mask pattern region 02 through the electroforming process. In this case, the second metal layer 12 covers the entire non-mask pattern region 02. In this way, the manufacturing of the second metal layer 12 is convenient, and the manufacturing process is simplified; meanwhile, the stress on the mask is more uniform when it is tensioned, and stress concentration is less likely to occur, which is beneficial to prevent the mask from being damaged during tensioning.

In some embodiments, as shown in FIG. 7, the mask 10 is composed of the first metal layer 11 and the second metal layer 12. The total thickness of the mask 10 in the non-mask pattern region 02 (e.g., the sum of the thickness of the first metal layer 11 and the thickness of the second metal layer 12) is in a range from approximately 20 μm to approximately 30 μm. It will be understood that the total thickness herein may also fluctuate by ten percent. For example, the total thickness may be 18 μm, 25 μm, or 33 μm. The thickness of the mask 10 in the mask pattern region 01 (e.g., the thickness of the first metal layer 11) is in a range from approximately 3 μm to approximately 10 μm, such as 5 μm. In this way, the mask 10 is thicker in the welding region 21 to meet the welding requirement of the mask 10; meanwhile, the mask 10 is thinner in the mask pattern region 01 to meet the manufacturing requirements of the organic light-emitting layers in the high-resolution and ultra-thin OLEO display panels.

It will be noted that, the first metal layer 11 is used as a part of the mask 10 in the present embodiment, however, a person skilled in the art may understand that in a case where the first metal layer 11 is manufactured through the electroforming process, the first metal layer 11 itself can be regarded as a conventional electroformed fine metal mask (electroformed FMM) with a uniform thickness. That is, in the present embodiment, an electroformed fine metal mask with a uniform thickness in the conventional sense may be directly used as the first metal layer 11 in the mask 10 of the present embodiment.

Figure 9:
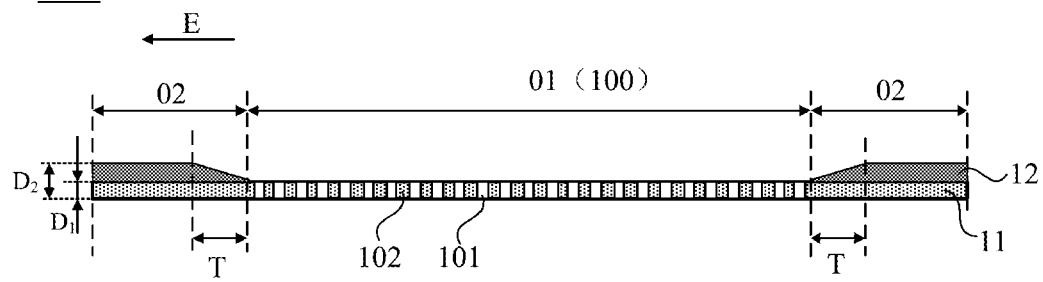
FIG. 9 is another section of the mask in FIG. 7 taken along the direction S-S'.
Figure 10:
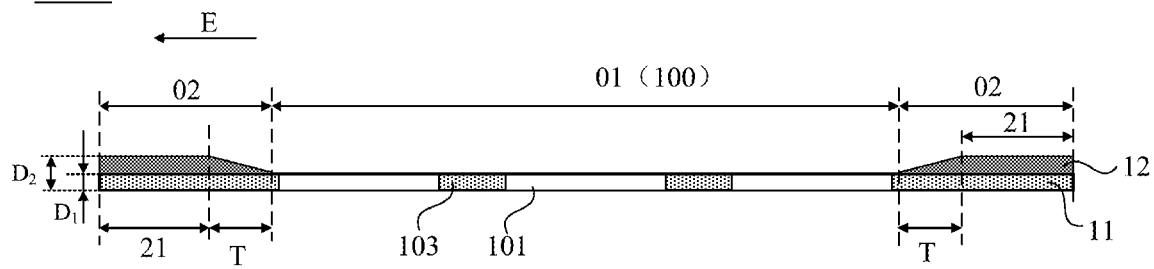
FIG. 10 is a section of the mask in FIG. 7 taken along direction M-M'.

On this basis, in order to relieve a sudden change in stress between the mask pattern region 01 and the non-mask pattern region 02 during a tensioning process of the mask 10 to improve the uniformity of the force in the mask 10, in some embodiments, as shown in FIGS. 9 and 10, the non-mask pattern region 02 of the mask 10 includes a transition region T located at a periphery of the mask pattern region 01 (i.e., adjacent to the mask pattern region 01). Moreover, a thickness of the mask 10 in the transition region T gradually increases from a first thickness $D_1$ to a second thickness $D_2$ along a first direction E. The first direction E points from a side of the transition region T where the transition region T is connected to the mask pattern region 01 to a side of the transition region T away from the mask pattern region 01. The first thickness $D_1$ is equal to the thickness of the shielding strip 102, and the second thickness $D_2$ is greater than the first thickness $D_1$. For example, as shown in FIGS. 9 and 10, the second thickness $D_2$ may be equal to a sum of the thickness of the shielding strip 102 and a thickness of a portion of the second metal layer 12 outside the transition region T. As a result, during the tensioning process, the stress gradually changes in the transition region through the portion in the transition region T, which relieves a sudden change in the stress in the mask caused by a sudden change in the thickness of the mask, and avoids problems such as appearance of wrinkles in the mask.

In the embodiments where the mask 10 is composed of the first metal layer 11 and the second metal layer 12, for example, the first thickness $D_1$ is equal to the thickness of the first metal layer 11. That is, the first thickness $D_1$ is the same as the thickness of the shielding strip 102, or the thickness of the space portion 103 of the mask 10 in the mask pattern region 01. The thickness of the second metal layer 12 in the transition region T gradually increases from 0 to $D_2$ minus $D_1$ ($D_2-D_1$, i.e., a difference between $D_2$ and $D_1$) along the first direction E, and the thickness of the second metal layer 12 outside the transition region T is the same, which is $D_2$ minus $D_1$ ($D_2-D_1$).

For example, as shown in FIG. 10, the transition region T and the welding region 21 in the non-mask pattern region 02 do not overlap. In this way, the thickness of the mask 10 in the welding region 21 is substantially the same, which is beneficial to improve the firmness after welding.

In some embodiments, a width range of the transition region T along the first direction E is approximately 1 μm to approximately 8 μm. It will be understood that, "approximately" herein means that the width range of the transition region T along the first direction E may fluctuate by ten percent. For example, the width of the transition region T along the first direction E may be 0.9 μm, 1 μm, 5 μm, 8 μm, or 8.8 μm.

In the present example, by setting the width of the transition region T along the first direction E to be greater than or equal to 1 μm (may also be 0.9 μm herein), a portion of the second metal layer 12 in the transition region T is able to be effectively used for stress buffering. Meanwhile, by setting the width of the transition region T along the first direction E to be less than or equal to 8 μm (8.8 μm), it is not easy to cause a width of the non-mask pattern region 02 of the mask 10 to increase, which is beneficial to reduce a waste of evaporation materials during evaporation.

For example, as shown in FIGS. 7, 9 and 10, the mask pattern region 01 is substantially rectangular. That is, the shape of the mask pattern region 01 may be a rectangle or an approximate rectangle with a smooth edge). A width range of a portion of the transition region T, which is located at opposite sides of the rectangle along a width direction thereof, along the first direction E is approximately 1 μm to approximately 3 μm; and/or, a width range of a portion of the transition region T, which is located at opposite sides of the rectangle along a length direction thereof, along the first direction E is approximately 3 μm to approximately 8 μm. Herein, the width range of the portion of the transition region T, which is located at the opposite sides of the rectangle along the width direction thereof, along the first direction E may fluctuate by ten percent, for example, the width is 0.9 μm, 1 μm, 2 μm or 3.3 μm. Similarly, the width range of the portion of the transition region T, which is located at the opposite sides of the rectangle along the length direction thereof, along the first direction E may fluctuate by ten percent, for example, the width is 2.7 μm, 5 μm, 8.8 μm.

In the tensioning process of the mask 10, it is necessary to apply a tension outward to both ends of the mask 10 in the length direction (for example, a tension of 2 N to 5 N is applied), and a component force of the tension along the length direction is large, and a component force along the width direction is small or may be zero. In the present example, the width range of the portion of the transition region T, which is located at the opposite sides of the rectangle along the length direction thereof, along the first direction E may be set to be greater than the width range of the portion of the transition region T, which is located at the opposite sides of the rectangle along the width direction thereof, along the first direction E. In this way, the mask 10 has a better stress buffering effect in the length direction than in the width direction during the tensioning process, which may better prevent the effective mask region of the mask 10 from deformation during the tensioning process, thereby helping to ensure the accuracy of the mask 10.

In some embodiments, in order to reduce the light reflection capacity of the mask to the laser in the non-mask pattern region 02 and improve the light absorption capacity thereof, in actual manufacturing of the second metal layer 12, metal with a large laser absorption coefficient such as copper (Cu) or tungsten (W) may be added to the second metal layer 12, which is more conducive to the control of the welding laser.

It will be noted that, in the embodiments of the present disclosure, the second metal layer 12 may be manufactured by using the electroforming process. A material of the second metal layer 12 may be nickel-iron alloy, and may also contain one or more of trace elements, such as silicon, manganese, titanium, oxygen, carbon, and phosphorus. For example, by adding at least one of $Cu^{2+}$ ion, $W^{6+}$ ion, or $W^{4+}$ ion into the electroforming the $Cu^{2+}$ ion, $W^{6+}$ ion or $W^{4+}$ ion is reduced to copper (Cu) or tungsten (W) under the action of electrodes, and are deposited on a surface of the first metal layer 11 in the non-mask pattern region 02. Of course, in practice, the content of copper (Cu) or tungsten (W) in the second metal layer 12 may be controlled by controlling a rate of the electroforming deposition. For example, the content may be 0.1%.

In addition, a person skilled in the art may understand that adding the ion with the large laser absorption coefficient (such as $Cu^{2+}$ ion, $W^{6+}$ ion or $W^{4+}$ ion) into the electroforming liquid has little effect on the thermodynamic performance of the formed second metal layer 12. As a result, normal masking process of the mask will not be affected when the reflection intensity of the mask to the laser during the welding process is reduced while effective welding is ensured.

Figure 11:
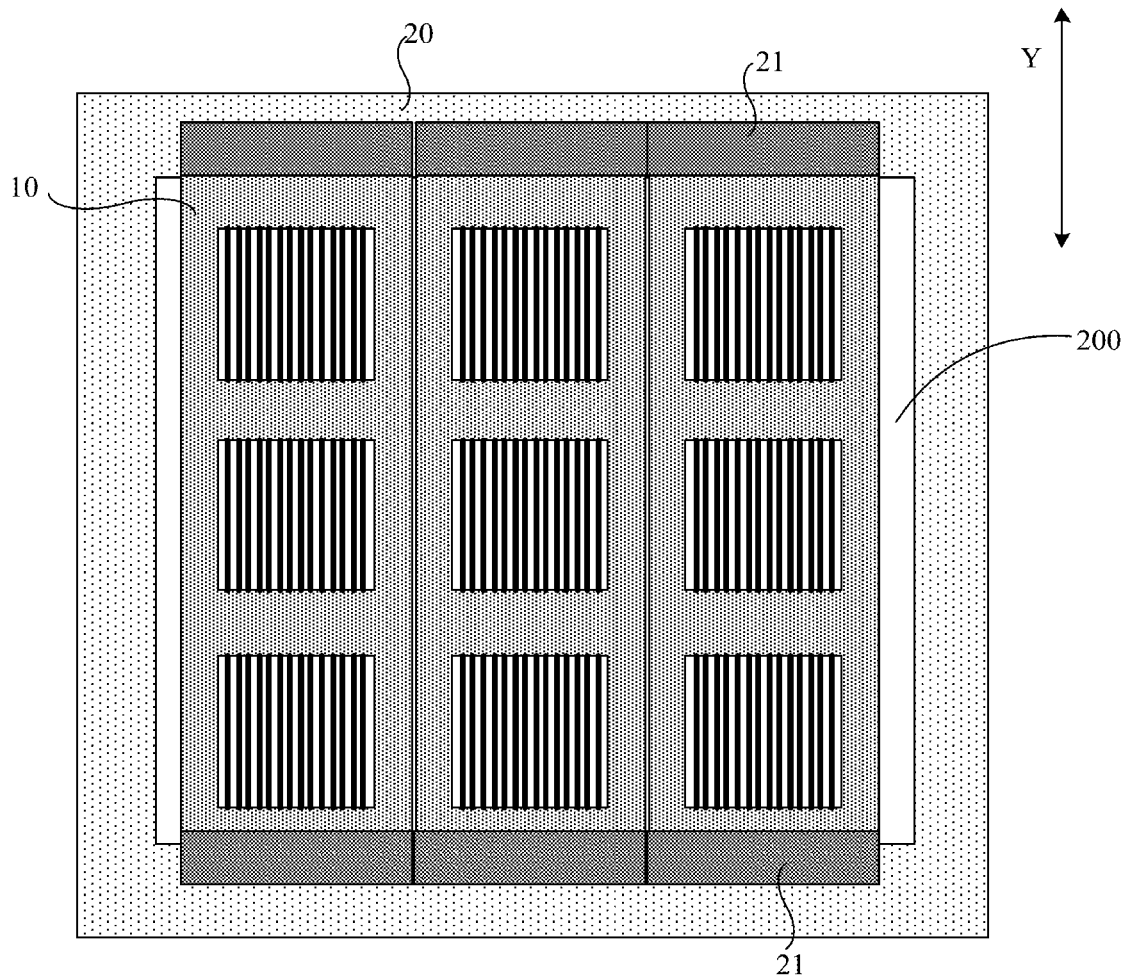
FIG. 11 is a diagram showing a structure of another mask assembly, in accordance with some embodiments of the present disclosure.

Some embodiments of the present disclosure further provide a mask assembly A. As shown in FIG. 11, the mask assembly A includes a frame 20 and at least one mask 10. The frame 20 is provided with an opening 200. The mask 10 is a mask 10 in any of the above embodiments, and each mask 10 spans the opening 200, and is welded to the frame 20 in the welding region(s) 21. For example, as shown in FIG. 11, welding regions 21 are disposed at the opposite ends of each mask 10 along the length direction Y of the mask respectively. That is, two welding regions 21 of each mask 10 are located at the opposite sides of the mask pattern region thereof.

For example, the mask 10 is substantially rectangular. After the mask 10 is tensioned along the length direction Y thereof, the mask is welded to the frame 20 through the welding regions 21. The thickness of the mask 10 after tensioning in the transition region is reduced by approximately 0 μm to approximately 0.1 μm (e.g., may also be 0 μm to 0.11 μm); and/or, a dimension of a portion of the tensioned mask 10 located in the transition region along the first direction E (as shown in FIGS. 9 and 10) increases by approximately 0 μm to approximately 0.1 μm (e.g., may also be 0 μm to 0.11 μm).

The mask assembly A provided in the present embodiment allows the mask 10 not to be damaged easily during the tensioning process; meanwhile, the stability and reliability of the mask 10 and the frame 20 after welding are improved.

Figure 12:
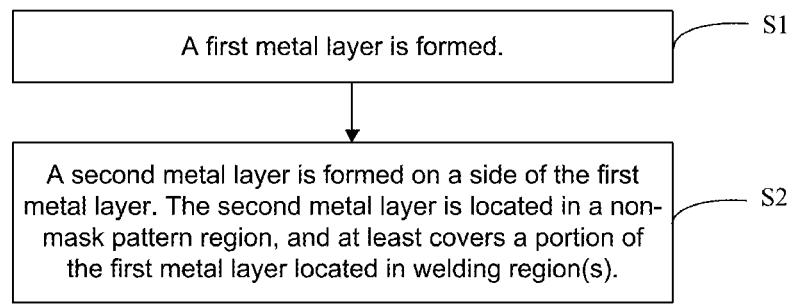
FIG. 12 is a flow diagram of a method of manufacturing a mask, in accordance with some embodiments of the present disclosure.

Some embodiments of the present disclosure further provide a method for manufacturing a mask. As shown in FIG. 12, the method includes S1 and S2.

Figure 13:
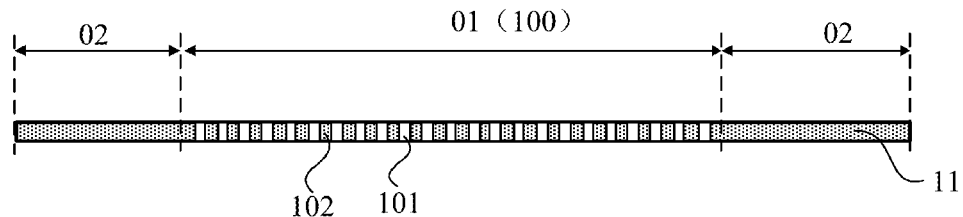
FIG. 13 is a diagram showing a structure of a first metal layer, in accordance with some embodiments of the present disclosure.

In S1, the first metal layer 11 is formed. Referring to FIG. 13, the first metal layer 11 (a plan view of the first metal layer 11 is substantially the same as a plan view of the mask shown in FIG. 4, which may refer to FIG. 4) extends from the mask pattern region 01 to the non-mask pattern region 02, and the first metal layer 11 covers the non-mask pattern region 02. In any effective mask region 100, the first metal layer 11 includes a plurality of evaporation holes 101 and a shielding strip 102 located between two adjacent evaporation holes 101.

It will be noted that, in a case where the mask pattern region 01 includes a plurality of effective mask regions 100, the first metal layer 11 further includes a space portion disposed between two adjacent effective mask regions 100 (e.g., the space portion 103 shown in FIG. 4, 5 or 7).

In S2, the second metal layer 12 is formed on a side of the first metal layer 11. Referring to FIGS. 6, 9 and 10, the second metal layer 12 is located in the non-mask pattern region 02, and at least covers a portion of the first metal layer 11 located in the welding region(s) 21.

Through the method in the present embodiment, the thickness of the portion of the formed mask in the non-mask pattern region 02 and at least in the welding region 21 is greater than the thickness of the shielding strip 102 of the mask in the effective mask region 01. Therefore, when the mask 10 and the frame 20 are welded, the problem that welding failures (the welding through phenomenon, the pseudo welding phenomenon, etc.) are caused by the fact that laser energy is difficult to control due to small thickness of the mask 10 in the welding region 21 is improved, and the welding reliability of the mask 10 is enhanced.

Figure 14:
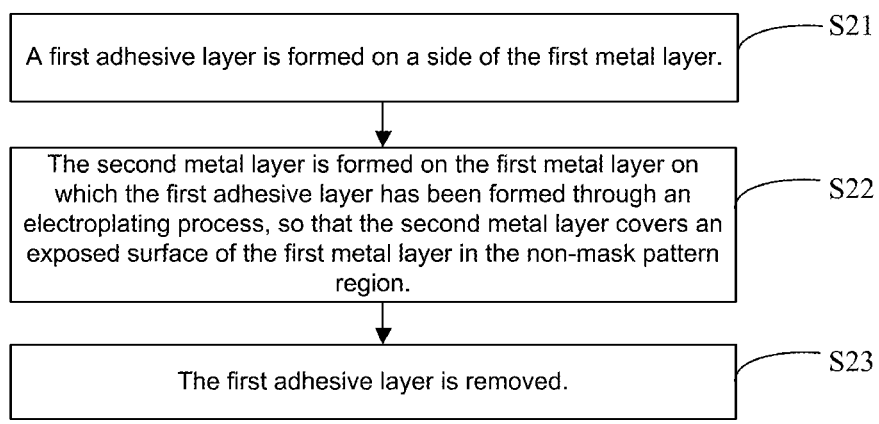
FIG. 14 is a flow diagram of another method of manufacturing a mask, in accordance with some embodiments of the present disclosure.

In some embodiments, referring to FIG. 14, S2 of the method includes S21.

Figure 15:
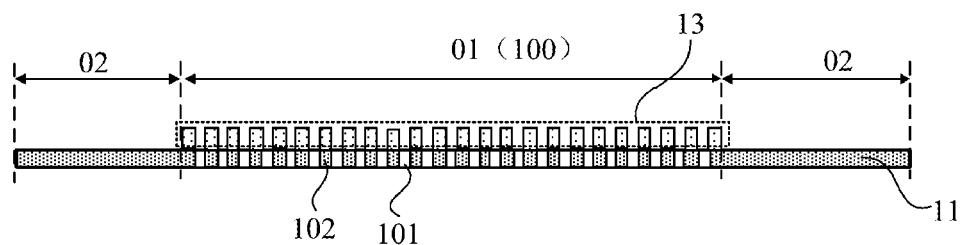
FIG. 15 is a diagram showing a structure of a first metal layer on which a first adhesive layer is formed, in accordance with some embodiments of the present disclosure.

In S21, a first adhesive layer 13 is formed on a side of the first metal layer 11. Referring to FIG. 15 the first adhesive layer 13 at least covers a portion of the first metal layer 11 other than the evaporation holes 101 in the mask pattern region 01. That is, the first adhesive layer 13 at least covers the shielding strip(s) 102 and the space portion(s) (the space portion 103 shown in FIG. 4, 5, or 7) of the first metal layer 11 in the mask pattern region 01.

It will be understood that, according to an actual coating process, an opening may form in the first adhesive layer 13 at the position of the evaporation hole 101, or a groove may form in the first adhesive layer 13 at the position of the evaporation hole 101, which is not limited in the embodiments of the present disclosure, so long as it can be ensured that the first adhesive layer 13 at least covers the shielding strip(s) 102 and the space portion(s) 103 of the first metal layer 11 in the mask pattern region 01.

Figure 16:
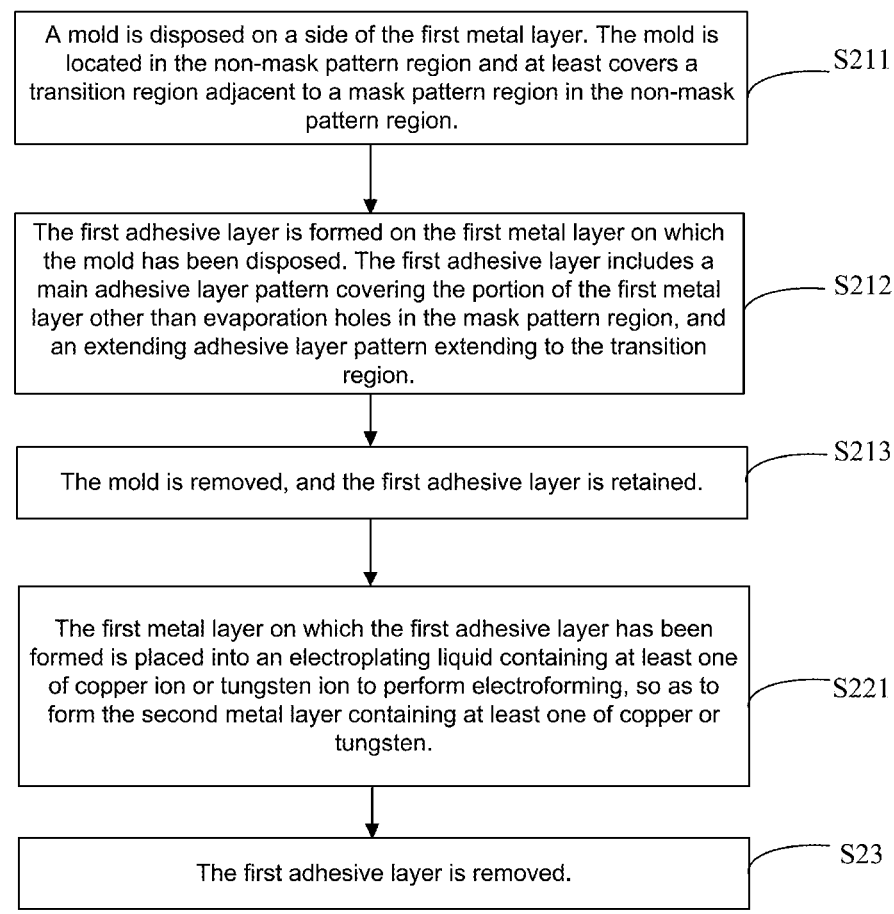
FIG. 16 is a flow diagram of yet another method of manufacturing a mask, in accordance with some embodiments of the present disclosure.

For example, referring to FIG. 16, the S21 includes S211 to S213.

Figure 17A:
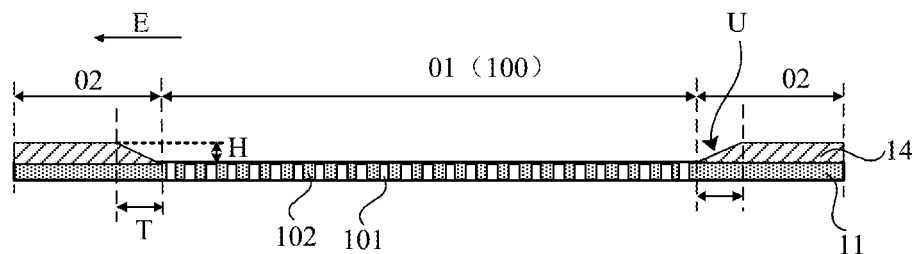
FIGS. 17a to 17c are diagrams showing structures of a mask corresponding to some steps in a manufacturing process, in accordance with some embodiments of the present disclosure.

In S211, a mold 14 is disposed on a side of the first metal layer 11. As shown in FIG. 17a, the mold 14 is located in the non-mask pattern region 02 and at least covers the transition region T adjacent to the mask pattern region 01 in the non-mask pattern region 02. That is, the mold 14 is disposed on a surface of the first metal layer 11 and located in the non-mask pattern region 02 at the periphery of the mask pattern region 01.

Referring to FIG. 17a, a thickness of the mold 14 in the transition region T adjacent to the mask pattern region 01 gradually increases from 0 to H along the first direction E; and a range of H is approximately 10 μm to approximately 27 μm. The width range of the transition region T along the first direction E is approximately 1 μm to approximately 3 μm. The first direction E points from a side of the transition region T where the transition region T is connected to the mask pattern region 01 to a side of the transition region T away from the mask pattern region 01.

For example, as shown in FIG. 17a, a portion of the mold 14 in the transition region T includes an inclined surface U with a fixed slope.

In S212, the first adhesive layer 13 is formed on the first metal layer 11 on which the mold 14 has been disposed.

Figure 17B:
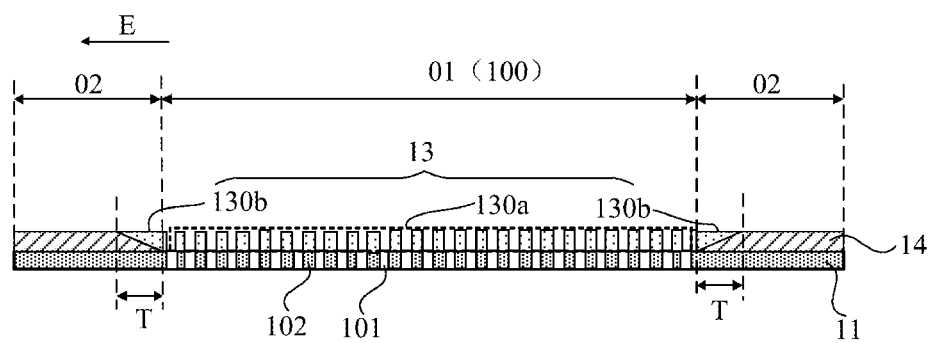

Referring to FIG. 17b, the first adhesive layer 13 includes: a main adhesive layer pattern 130a covering the portion of the first metal layer 11 other than the evaporation holes 101 in the mask pattern region 01, and an extending adhesive layer pattern 130b extending to the transition region T. The extending adhesive layer pattern 130b covers the inclined surface U of the mold 14.

Figure 17C:
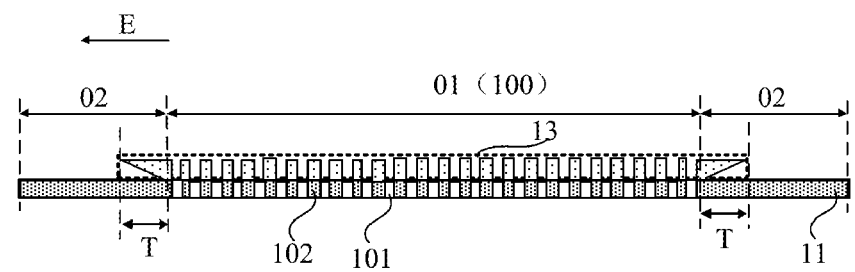

In S213, the mold 14 is removed, and the first adhesive layer 13 is retained to form a structure shown in FIG. 17c.

In this case, referring to FIG. 17c, the first adhesive layer 13 has a hanging inclined surface in the transition region T. The following embodiments are all described based on this.

Figure 18A:
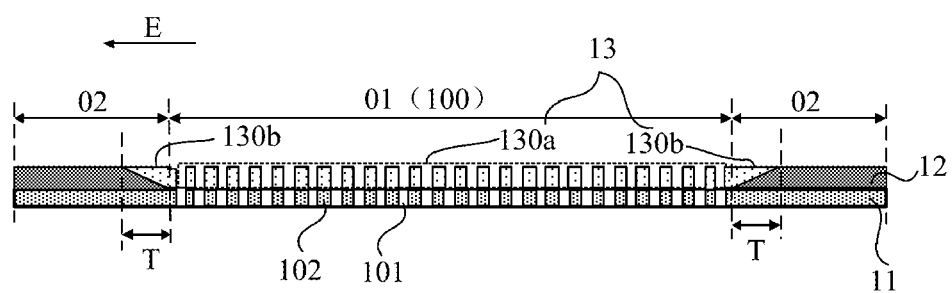
FIGS. 18a to 18b are diagrams showing structures of a mask corresponding to some other steps in a manufacturing process, in accordance with some embodiments of the present disclosure.

The S2 of the method further includes S22 and S23. Referring to FIGS. 14 and 18a, the electroforming process is used to form the second metal layer 12 on the first metal layer 11 on which the first adhesive layer 13 has been formed, so that the second metal layer 12 covers the portion of the first metal layer 11 in the non-mask pattern region 02. That is, the second metal layer 12 is formed on the exposed surface of the first metal layer 11, on which the first adhesive layer 13 has been formed, in the non-mask pattern region 02.

Referring to FIG. 17c, since the first adhesive layer 13 has the hanging inclined surface in the transition region T, when the second metal layer 12 is formed through the electroforming process, limited by the hanging inclined surface of the first adhesive layer 13 in the transition region T, referring to FIG. 18a, the formed second metal layer 12 is made to have a slope surface in the transition region T, and the thickness of the formed second metal layer 12 in the transition region T increases along the first direction E, which is from a side of the transition region T approximate to the mask pattern region 01 to a side of the transition region T away from the mask pattern region 01. As a result, during tensioning the mask, the stress gradually changes through the portion of the transition region T with the slope surface, which relieves the sudden change in the stress in the mask caused by the sudden change in the thickness of the mask, and avoids problems such as appearance of wrinkles in the mask.

For example, in the process of forming the second metal layer 130 through the electroforming process:

First, before the electroforming is performed, the first metal layer 11 on which the first adhesive layer 13 has been formed is cleaned using alcohol and deionized wind;

Then, the first metal layer 11 on which the first adhesive layer 13 has been formed is placed on a supporting electrode. Of course, the first metal layer 11 may also be placed on the supporting electrode before the first adhesive layer 13 is formed. Next, referring to FIG. 16, in S221, the first metal layer 11, on which the first adhesive layer 13 has been formed, that is carried by the supporting electrode is placed into the electroforming liquid added with at least one of copper ion (e.g., $Cu^{2+}$) and tungsten ion (e.g., $W^{6+}$ or $W^{4+}$) to perform electroforming.

For example, in the electroforming process, the first metal layer 11 and the supporting electrode that are regarded as a whole are used as a cathode, and the metal (e.g., nickel-iron alloy) that needs to be electroformed is selected as an anode. Of course, the electroforming liquid is a solution containing anode metal ion. Under the action of a power source, the metal ion in the electroforming liquid is reduced to metal on the exposed surface of the first metal layer 11 in the non-mask pattern region 02, and the metal may be deposited on the surface to form the second metal layer 12.

After the electroforming is completed, a mechanical manner or a laser manner may be used to separate the supporting electrode from the mask.

It will be understood that, by adding ion with a large laser absorption coefficient such as $Cu^{2+}$ ion or $W^{6+}$ ion into the electroforming liquid, the formed second metal layer 12 has copper (Cu) or tungsten (W), which may reduce the light reflection capacity of the thickened second metal layer 12 of the mask to the laser, and improve the light absorption capacity thereof, which is more conducive to the control of the welding laser.

Figure 18B:
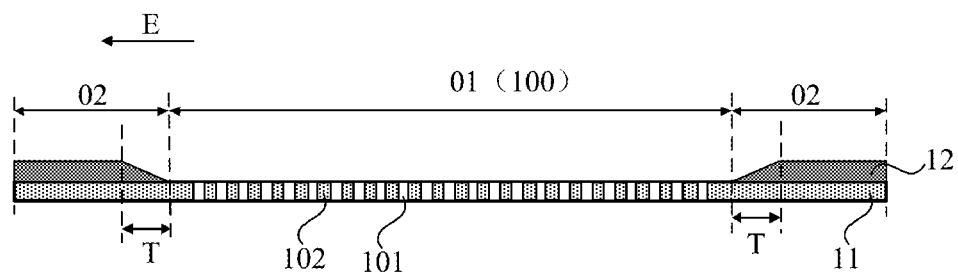

Finally, in S23, the first adhesive layer 13 is removed to form the mask 10 as shown in FIG. 18b.

It will be noted that, with respect to other related content in the method of the mask, for example, the content of the thicknesses of the first metal layer and the second metal layer, reference may be made to the corresponding parts in the foregoing embodiments of the mask; and with respect to other related structures in the foregoing embodiments of the mask, reference may be made to the above method for manufacturing the mask and the process may be adjusted, which will not be repeated here.

The foregoing descriptions are merely specific implementation manners of the present disclosure, but the protection scope of the present disclosure is not limited thereto. Any person skilled in the art could conceive of changes or replacements within the technical scope of the present disclosure, which shall all be included in the protection scope of the present disclosure. Therefore, the protection scope of the present disclosure shall be subject to the protection scope of the claims.

What is claimed is:

1. A mask, having a mask pattern region and a non-mask pattern region located at a peripheral of the mask pattern region, wherein
the mask pattern region includes at least one effective mask region; and in any of the at least one effective mask region, the mask comprises:
a plurality of evaporation holes, and
at least one shielding strip, wherein each shielding strip is located between two adjacent evaporation holes;
the mask has at least one welding region in the non-mask pattern region; and
a thickness of a portion of the mask in the non-mask pattern region and at least in a welding region is greater than a thickness of the shielding strip of the mask in the at least one effective mask region;
and the thickness refers to a dimension of a corresponding portion along a direction perpendicular to a plane where the mask is located,
wherein the mask comprises:
a first metal layer, wherein the first metal layer at least includes the shielding strip in the at least one effective mask region, and the first metal layer covers the non-mask pattern region; and
a second metal layer stacked with the first metal layer along a thickness direction of the mask, wherein the second metal layer is located in the non-mask pattern region, and covers a portion of the first metal layer located in the non-mask pattern region,
wherein the non-mask pattern region includes a transition region adjacent to the mask pattern region,
wherein a thickness of the mask in the transition region gradually increases from a first thickness to a second thickness along a first direction, and the first direction points from a side of the transition region where the transition region is connected to the mask pattern region to a side of the transition region away from the mask pattern region, and
wherein the first thickness is equal to the thickness of the shielding strip; and the second thickness is equal to a sum of the thickness of the shielding strip and a thickness of a portion of the second metal layer outside the transition region.

2. The mask according to claim 1, wherein the mask pattern region includes two or more effective mask regions; and
in the mask pattern region, the mask comprises
at least one space portion, wherein each space portion is located between two adjacent effective mask regions, and thickness of the space portion is the same as the thickness of the shielding strip.

3. The mask according to claim 1, wherein the at least one welding region is arranged in the following ways:
the at least one welding region and the transition region do not overlap; and/or,
a number of the least one welding region is two, and the two welding regions are located at opposite sides of the mask pattern region.

4. The mask according to claim 1, wherein
a width range of the transition region along the first direction is approximately 1 µm to approximately 8 µm.

5. The mask according to claim 1, wherein the mask pattern region is substantially in a shape of a rectangle;
a width range of a portion of the transition region, which is located at opposite sides of the rectangle along a width direction of the rectangle, along the first direction is approximately 1 µm to approximately 3 µm and/or
a width range of a portion of the transition region, which is located at opposite sides of the rectangle along a length direction of the rectangle, along the first direction approximately 3 µm to approximately 8 µm.

6. The mask according to claim 1, wherein a thickness range of a portion of the mask in the non-mask pattern region outside the transition region is approximately 20 µm to approximately 30 µm.

7. The mask according to claim 1, wherein a material of the second metal layer includes at least one of copper or tungsten.

8. The mask according to claim 1, wherein a thickness range of the first metal layer is approximately 3 µm to approximately 10 µm.

9. The mask according to claim 1, wherein a thickness range of the shielding strip of the mask in the at least one effective mask region is approximately 3 µm to approximately 10 µm.

10. A mask assembly, comprising:
a frame provided with an opening: and
at least one mask according to claim 1, wherein each mask spans the opening, and welded to the frame in the at least one welding region.

11. A method of manufacturing a mask, the mask having a mask pattern region and a non-mask pattern region located at a peripheral of the mask pattern region; the mask pattern region including at least one effective mask region; and the mask having at least one welding region in the non-mask region;
the method comprising:
forming a first metal layer, where the first metal layer extends from the mask pattern region to the non-mask pattern region, and covers the non-mask pattern region; and in any of the at least one effective mask region, the first metal layer includes a plurality of evaporation holes and at least one shielding strip, and each shielding strip is located between two adjacent evaporation holes; and
forming a second metal layer on a side of the first metal layer, wherein the second metal layer is located in the non-mask pattern, and at least covers a portion of the first metal layer located in the at least one, welding region; and a thickness of a portion of the mask in the non-mask pattern region and at least in a welding region is greater than a thickness of the shielding strip of the mask in the at least one effective mask region,
wherein forming a second metal layer on a side of the first metal layer, including:
forming a first adhesive layer on a side of the first metal layer, wherein the first adhesive layer at least covers a portion of the first metal layer other than the evaporation holes in the mask pattern region;
forming the second metal layer on the first metal layer on which the first adhesive layer has been formed through an electroforming process, wherein the second metal layer covers an exposed surface of the first metal layer in the non-mask pattern region; and
removing the first adhesive layer,
wherein forming a first adhesive layer on a side of the first metal layer, including:
providing a mold on a side of the first metal layer, wherein the mold is located in the non-mask pattern region, and at least covers a transition region adjacent to the mask pattern region in the non-mask pattern region; a thickness of the mold in the transition region gradually increases from 0 to H along a first direction; a range of H is approximately 10 μm to approximately 27 μm; a width range of the transition region along the first direction is approximately 1 μm to approximately 3 μm; and the first direction points from a side of the transition region where the transition region is connected to the mask pattern region to a side of the transition region away from the mask pattern region;

forming the first adhesive layer on the first metal layer on which the mold has been disposed, wherein the first adhesive layer includes: a main adhesive layer pattern covering the portion of the first metal layer other than the evaporation holes in the mask pattern region, and an extending adhesive layer pattern extending to the transition region; and the extending adhesive layer pattern covers a portion of the mold located in the transition region; and removing the mold and retaining the first adhesive layer.

12. The method of the manufacturing the mask according to claim 11, wherein forming the second metal layer on the first metal layer on which the first adhesive layer has been formed through an electroforming process, includes:

placing the first metal layer on which the first adhesive layer has been formed in an electroforming liquid having at least one of copper ion or tungsten ion to perform electroforming, so as to form the second metal layer containing at least one of copper of tungsten.

* * * * *